United States Patent
Kunihisa et al.

(10) Patent No.: US 10,386,765 B2
(45) Date of Patent: Aug. 20, 2019

(54) IMAGE FORMATION APPARATUS FOR PREVENTING A THERMAL LOAD DEFECT

(71) Applicant: Konica Minolta, Inc., Chiyoda-ku, Tokyo (JP)

(72) Inventors: Teppei Kunihisa, Toyohashi (JP); Munenori Nakano, Toyokawa (JP)

(73) Assignee: KONICA MINOLTA, INC., Chiyoda-Ku, Tokyo (JP)

( * ) Notice: Subject to any disclaimer, the term of this patent is extended or adjusted under 35 U.S.C. 154(b) by 0 days.

(21) Appl. No.: 15/895,206

(22) Filed: Feb. 13, 2018

(65) Prior Publication Data

US 2018/0231927 A1    Aug. 16, 2018

(30) Foreign Application Priority Data

Feb. 14, 2017  (JP) ................. 2017-024679

(51) Int. Cl.
| | |
|---|---|
| G03G 21/20 | (2006.01) |
| G03G 15/00 | (2006.01) |
| H05K 7/20 | (2006.01) |
| G03G 15/08 | (2006.01) |

(Continued)

(52) U.S. Cl.
CPC ......... G03G 15/5004 (2013.01); G03G 15/80 (2013.01); G03G 21/206 (2013.01); H05K 7/20727 (2013.01); *G03G 15/0867* (2013.01); *G03G 21/1633* (2013.01); *G03G 2215/066* (2013.01); *H05K 7/1487* (2013.01)

(58) Field of Classification Search
CPC .. G03G 15/5004; G03G 15/80; G03G 21/206; G03G 15/0867; G03G 21/1633; G03G 2215/066; G03G 2221/1645; H05K 7/20727; H05K 7/1487
See application file for complete search history.

(56) References Cited

U.S. PATENT DOCUMENTS

| | | | |
|---|---|---|---|
| 2002/0071691 A1* | 6/2002 | Jones ................. | G03G 21/00 399/91 |
| 2005/0058467 A1* | 3/2005 | Sasamoto .......... | G03G 15/2039 399/67 |

(Continued)

FOREIGN PATENT DOCUMENTS

| | | |
|---|---|---|
| JP | 2010-217474 A1 | 9/2010 |
| JP | 2012-230245 A1 | 11/2012 |
| JP | 2014-233934 A1 | 12/2014 |

OTHER PUBLICATIONS

First Office Action dated Apr. 12, 2019 issued by the National Intellectual Property Administration of the People's Republic of China in corresponding Chinese Patent Application No. 201810141148.5 (14 pages) with English Translation.

*Primary Examiner* — David M. Gray
*Assistant Examiner* — Laura Roth
(74) *Attorney, Agent, or Firm* — Buchanan Ingersoll & Rooney PC

(57) ABSTRACT

An image formation apparatus provided with an image forming unit and a server unit in a single housing includes a power supply unit that supplies the image forming unit and the server unit with power and a fan that sends external air into the server unit, and when supplying the image forming unit with power from the power supply unit is stopped the fan is still driven and sending external air into the server unit is thus not stopped.

9 Claims, 8 Drawing Sheets

(51) Int. Cl.
*H05K 7/14* (2006.01)
*G03G 21/16* (2006.01)

(56) References Cited

U.S. PATENT DOCUMENTS

| | | |
|---|---|---|
| 2010/0166448 A1* | 7/2010 | Mikami ............. G03G 15/5004 399/88 |
| 2010/0239307 A1 | 9/2010 | Onuma et al. |
| 2014/0301744 A1* | 10/2014 | Tenjiku .............. G03G 21/1623 399/13 |
| 2014/0359327 A1 | 12/2014 | Matsushima |
| 2017/0017442 A1* | 1/2017 | Ishii ...................... G06F 3/1206 |

* cited by examiner

IMAGE FORMATION APPARATUS FOR PREVENTING A THERMAL LOAD DEFECT

The entire disclosure of Japanese Patent Application No. 2017-024679, filed on Feb. 14, 2017, is incorporated herein by reference in its entirety.

BACKGROUND

Technological Field

The present invention relates to an image formation apparatus having a server unit and an image forming unit integrated together.

Description of the Related Art

Japanese Laid-Open Patent Publication Nos. 2014-233934, 2010-217474, and 2012-230245 each discloses an invention relating to an image formation apparatus or the like.

Japanese Laid-Open Patent Publication No. 2014-233934 discloses an electronic device wherein when a main switch of the electronic device is turned off and thereafter once a prescribed period of time has elapsed, driving a cooling fan is stopped. Japanese Laid-Open Patent Publication Nos. 2010-217474 and 2012-230245 each disclose an electronic device wherein when a maintenance door is opened an interlock function operates to stop supplying electronic power to the image formation apparatus or the like.

SUMMARY

For example, an image formation apparatus having a server unit and an image forming unit integrated together needs to have the server unit kept in operation even after supplying the image forming unit with power is stopped. Accordingly, even when the image forming unit is not supplied with power and cooling the image forming unit (or driving a fan) is stopped, a. thermal load on the server unit needs to be considered even after the image forming unit's power supply is turned off.

The present image formation apparatus has been made in view of the above problem, and contemplates an image formation apparatus having a server unit and an image forming unit integrated together, that can prevent a defect that is caused by a thermal load on the server unit even when driving a fan of the image forming unit is stopped.

To achieve at least one of the abovementioned objects, according to an aspect of the present invention, an image formation apparatus reflecting one aspect of the present invention is provided with an image forming unit and a server unit in a single housing and comprises: a fan that ventilates the server unit; a power supply unit that supplies the image forming unit and the fan with power; and a power supply control unit that controls the power supply unit so that supplying the fan with power is not stopped when supplying power from the power supply unit to the image forming unit is stopped.

In another aspect, the present image formation apparatus is an image formation apparatus provided with an image forming unit and a server unit in a single housing, the image forming unit including a unit that accommodates a toner bottle therein, the housing including a maintenance door provided to the unit so as to be capable of being opened and closed to allow the toner bottle to be attached and detached, and a same surface side suction portion that is provided in a same surface as the maintenance door for taking external air into the server unit, when the maintenance door is opened, sucking external air through the same surface side suction portion being stopped.

BRIEF DESCRIPTION OF THE DRAWINGS

The advantages and features provided by one or more embodiments of the invention will become more fully understood from the detailed description given hereinbelow and the appended drawings which are given by way of illustration only, and thus are not intended as a definition of the limits of the present invention.

DETAILED DESCRIPTION OF EMBODIMENTS

Hereinafter, one or more embodiments of the present invention will be described with reference to the drawings. However, the scope of the invention is not limited to the disclosed embodiments.

An image formation apparatus in each embodiment will now be described hereinafter with reference to the drawings. Note that in each embodiment described hereafter, when numbers, amounts and the like are referred to, the present invention is not necessarily limited in scope thereto unless otherwise indicated. Identical and corresponding components and parts are identically denoted and may not be described redundantly. Furthermore, the drawings are not shown in accordance with an actual dimensional ratio, and, to facilitate understanding a structure, there is a portion shown changed in ratio to clarify the structure.

First Embodiment: Image Formation Apparatus 100

Figure 1:
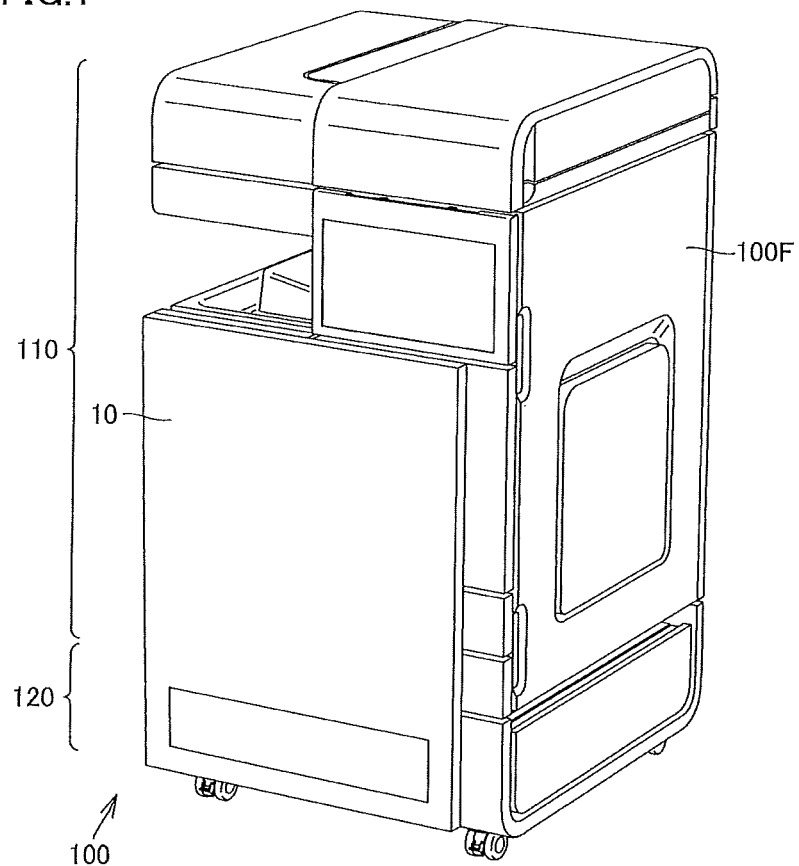
FIG. 1 generally shows an appearance of an image formation apparatus according to a first embodiment in a perspective view.
Figure 2:
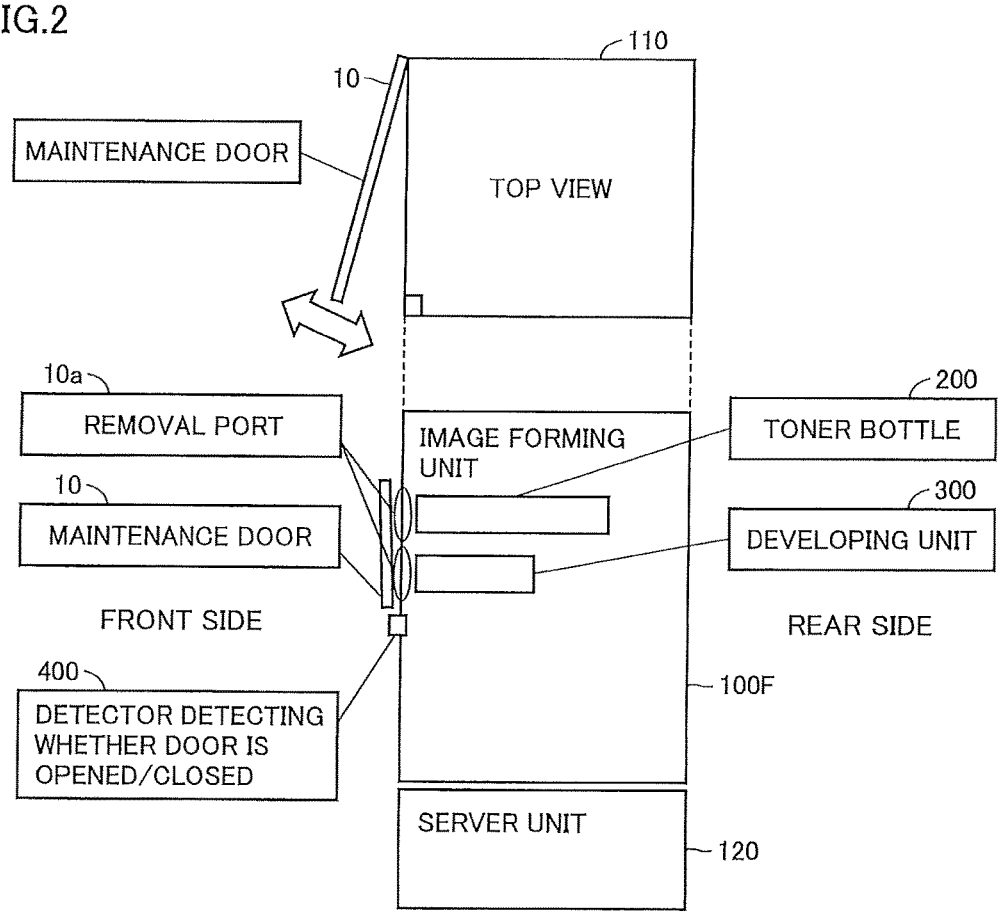
FIG. 2 schematically shows the image formation apparatus according to the first embodiment in top and side views.

With reference to FIG. 1 and FIG. 2, a general configuration of an image formation apparatus 100 in the present embodiment will be described. FIG. 1 generally shows an appearance of image formation apparatus 100 in a perspective view, and FIG. 2 schematically shows image formation apparatus 100 in top and side views.

Image formation apparatus 100 has an image forming unit 110 having an image forming unit and a server unit 120 provided in a single housing 100F and integrated together. Image formation apparatus 100 according to the present embodiment has server unit 120 disposed under (or at a bottom of) image forming unit 110.

Image forming unit 110 has an image forming unit of an electrophotographic system, and transfers an image formed with a toner to a sheet medium and fixes the image thereto. As shown in FIG. 2, a toner bottle 200 holding the toner and a developing unit 300 are configured to be detachable from a front surface side of housing 100F. The front surface of housing 100F means a side on which a user of image formation apparatus 100 stands to operate image formation apparatus 100.

Toner bottle 200 and developing unit 300 are removed through a removal port 10a, which in a normal state is closed by a maintenance door 10. Maintenance door 10 can be opened and closed by a user and a service person. Maintenance door 10 is provided with a detector 400 detecting whether the door is opened/closed.

Maintenance door 10 is provided with a protrusion, and in a state with maintenance door 10 closed the protrusion is accommodated in a recess provided on the side of the main body of housing 100F. A photosensor installed on the side of the main body generates an electrical signal corresponding to an opened/closed state of maintenance door 10. This electrical signal is transmitted to a system control unit of the image forming unit and a photosensor control unit independent of the image forming unit, and each unit detects whether the door is opened/closed.

(System Configuration of Image Formation Apparatus 100)

Figure 3:
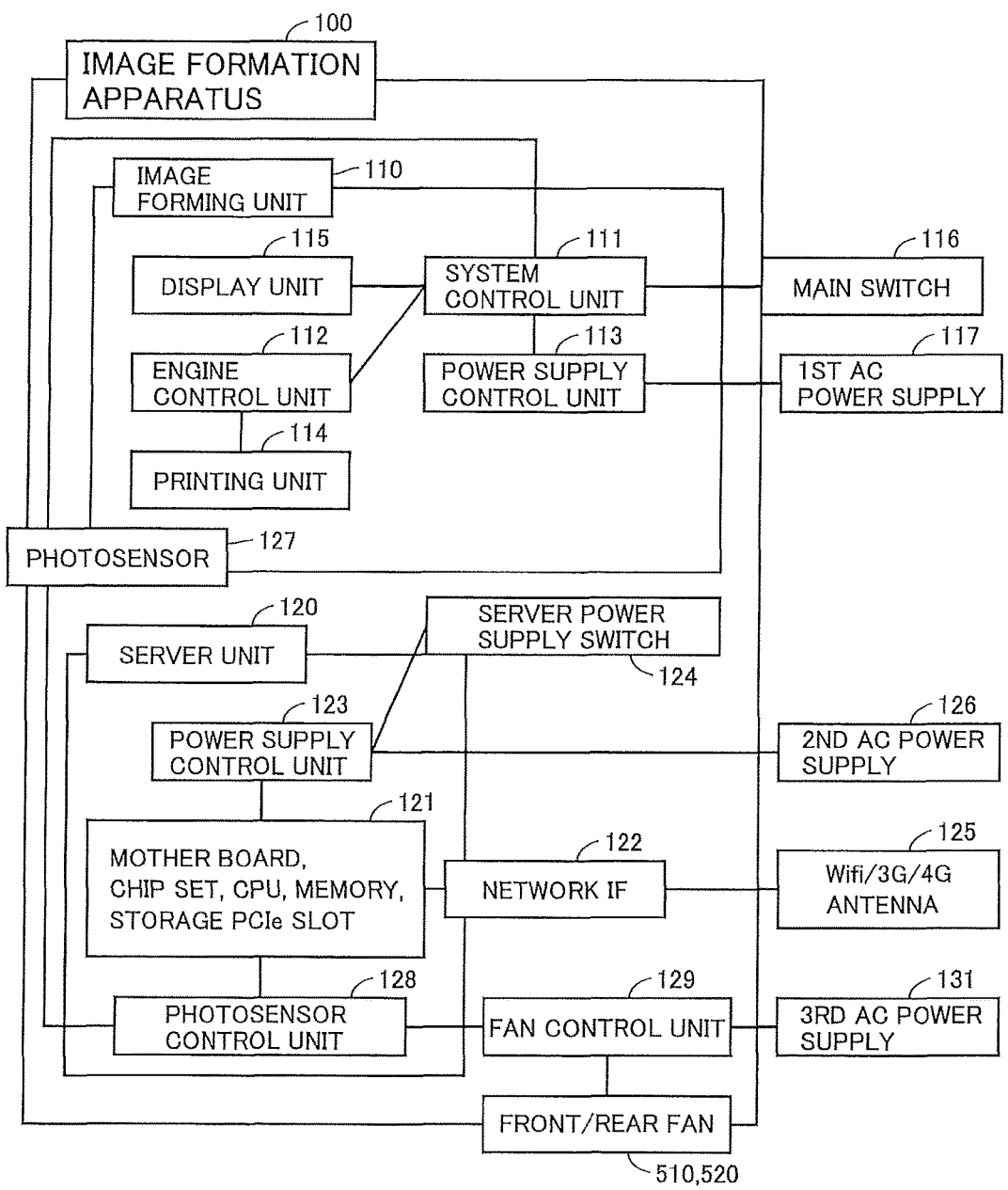
FIG. 3 is a block diagram showing a system configuration of the image formation apparatus according to the first embodiment.
Figure 4:
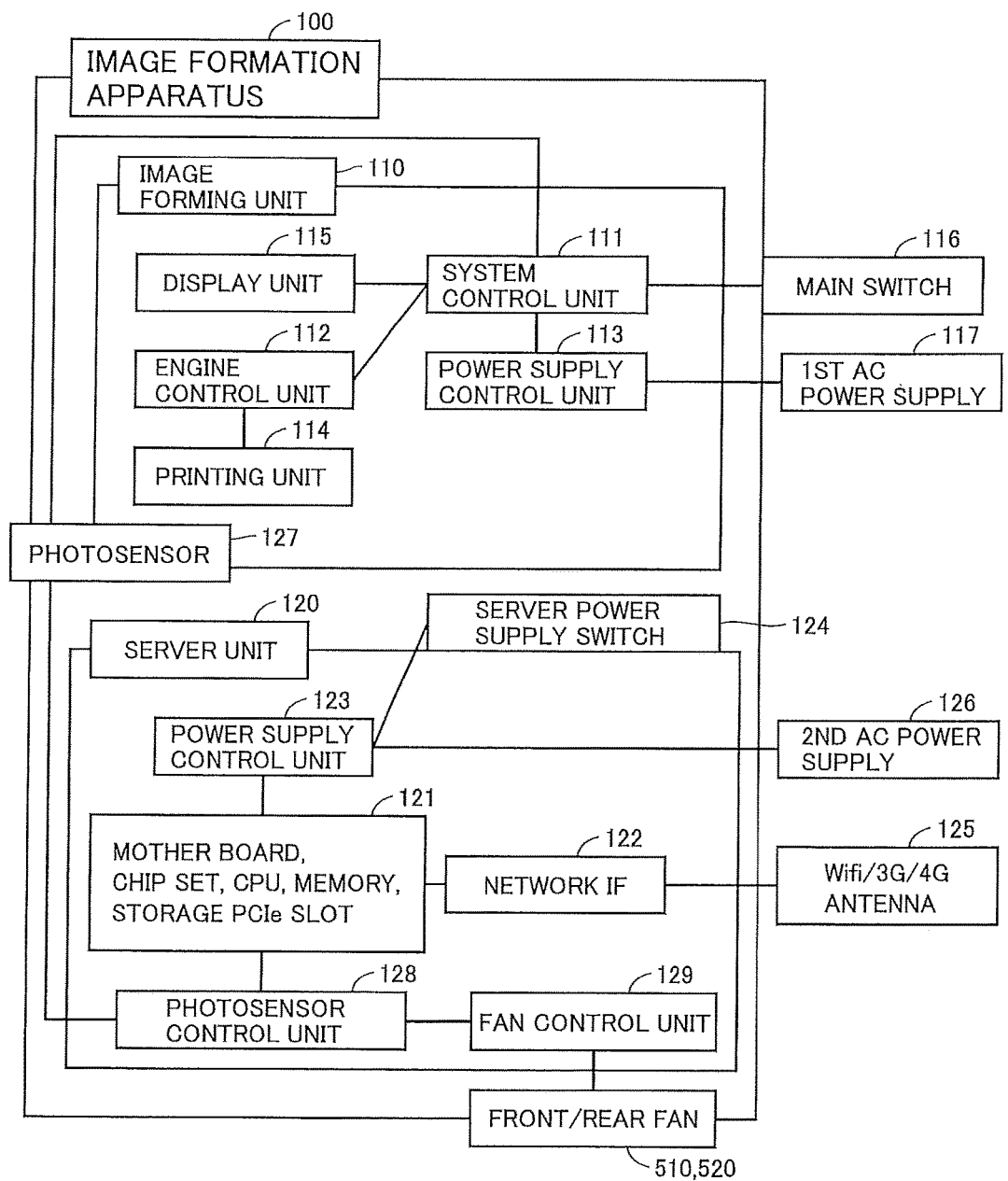
FIG. 4 is a block diagram showing a partial modification of the system configuration of the image formation apparatus according to the first embodiment.

With reference to FIG. 3 and FIG. 4, a system configuration of image formation apparatus 100 will be described. FIG. 3 is a block diagram showing the system configuration of image formation apparatus 100, and FIG. 4 is a block diagram showing a partial modification of the system configuration of image formation apparatus 100.

Image formation apparatus 100 includes image forming unit 110 and server unit 120. The system of image forming unit 110 includes a system control unit 111, an engine control unit 112, a power supply control unit 113, a printing unit 114, a display unit 115, and a main switch 116.

When main switch 116 is turned on, system control unit 111 detects it and power is received from power supply control unit 113 connected to a first AC power supply 117. From the viewpoint of energy saving, power supply is usually turned off at night and turned during the daytime.

Server unit 120 includes a mother board 121 (having a chip set, a CPU, a memory, etc. mounted thereon), a network IF 122, a power supply control unit 123, and a power supply switch 124. Server unit 120 is connected via network IF 122 to Wifi (registered trademark: Wireless Fidelity) and an antenna 125, and constantly communicates with a client through a network.

In contrast to image forming unit 110, server unit 120 is powered on all the time including nighttime. Server unit 120 is supplied with power by a second AC power supply 126 different than image forming unit 110 and thus operates. A photosensor serving as detector 400 detecting whether maintenance door 10 is opened/closed is connected to mother board 121 via a photosensor control unit 128.

Photosensor control unit 128 is connected to a fan control unit 129 and notifies fan control unit 129 of whether maintenance door 10 is opened/closed. Fan control unit 129 is supplied with power by a third AC power supply 131 different than image forming unit 110, and drives a front fan 510 and a rear fan 520. Fan control unit 129 may be supplied with power from a power supply different than server unit 120, as shown in FIG. 3, or may be supplied with power via server unit 120, as shown in FIG. 4.

First AC power supply 117, second AC power supply 126, and third AC power supply 131 configure a power supply unit of image formation apparatus 100. In particular, first AC power supply 117 configures a power supply unit for the image forming unit, and third AC power supply 131 configures a power supply unit for a fan.

(Hardware Configuration of Server Unit 120)

Figure 5:
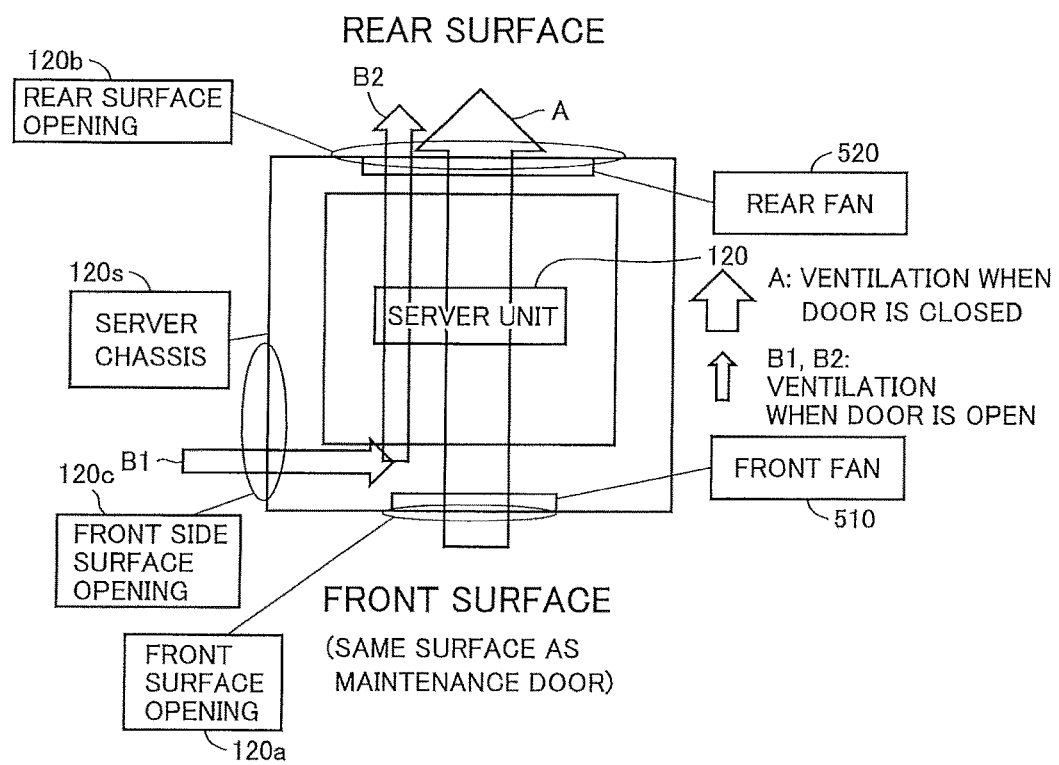
FIG. 5 is a plan view schematically showing a hardware configuration of a server unit of the image formation apparatus according to the first embodiment.

With reference to FIG. 5, a hardware configuration of server unit 120 will be described. FIG. 5 is a plan view schematically showing the hardware configuration of server unit 120. The hardware of server unit 120 includes server unit 120, a server chassis 120s, a front fan 510 for air intake, and a rear fan 520 for exhaust. Server unit 120, front fan 510, and rear fan 520 are attached to server chassis 120s.

Server chassis 120s is provided with a front surface opening 120a, a rear surface opening 120b, and a front side surface opening 120c. Front surface opening 120a is provided in the same surface as maintenance door 10, and accordingly, configures a suction portion on the side of the same surface as maintenance door 10 (hereinafter also referred to as "the same surface side suction portion"). Rear surface opening 120b and front side surface opening 120c are provided in a surface different than maintenance door 10, and accordingly, configures a suction portion on the side of a surface different than maintenance door 10 (hereinafter also referred to as "the different surface side suction portion"). The front surface is the same side as a surface provided with maintenance door 10.

When maintenance door 10 is opened, the open state of maintenance door 10 is detected by photosensor control unit 128. Photosensor control unit 128 notifies fan control unit 129 of the open state. In response, fan control unit 129 stops driving front fan 510. In contrast, rear fan 520 is constantly driven. As a result, by opening and closing maintenance door 10, two streams of air are obtained, as follows:

A first stream of air (in a state with maintenance door 10 closed): Front fan 510 and rear fan 520 are driven to suck air from the front side and exhaust the air to the rear side (as indicated in FIG. 5 by an arrow A); and A second stream of air (in a state with maintenance door 10 open): Front fan 510 is stopped rear fan 520 is alone driven to suck air through front side surface opening 120c and exhaust the air to the rear side (as indicated in FIG. 5 by arrows B1 and B2).

Normally, it is expected that image formation apparatus 100 is disposed with the side and rear surfaces facing a wall, and accordingly, the first stream of air can cool server unit 120 more stably and effectively.

The system configuration of image formation apparatus 100 in the present embodiment can achieve the following effect: In a normal operation when supplying image forming unit 110 with power is stopped server unit 120 is supplied with power from a power supply different from that of image forming unit 110. As a result, sever cooling front fan 510 and rear fan 520 are not stopped, and a defect caused by a thermal load on an electronic board or the like of server unit 120 can be avoided.

When maintenance door 10 is in the open state, it is determined that image formation apparatus 100 is in a condition which requires maintenance such as exchanging toner bottle 200, adjusting developing unit 300, removing clogging of a sheet medium and the like. In that case, fan control unit 129 stops driving front fan 510. This allows external air to be constantly taken into server unit 120 while preventing toner particles spilled downward during maintenance from entering server chassis 120s.

Second Embodiment

The present embodiment provides a basic configuration identical to that of image formation apparatus 100 of the first embodiment. In the present embodiment, server unit 120 comprises server chassis 120s provided with front side surface opening 120c having an opening area larger than that of front surface opening 120a.

For example, when front side surface opening 120c and front surface opening 120a have equal opening areas, a filter having an opening ratio A is disposed in front side surface opening 120c, and a filter having a smaller opening ratio than opening ratio A is disposed in front surface opening 120a.

With this configuration, when maintenance door 10 is opened and front fan 510 is stopped, rear fan 520 continuously driven exhausts air, and external air is taken into server unit 120 preferentially from front side surface opening 120c having the large opening ratio. This can more effectively suppress intrusion into server unit 120 of toner particles spilled during maintenance than the first embodiment.

Third Embodiment: Image Formation Apparatus 100A

Figure 6:
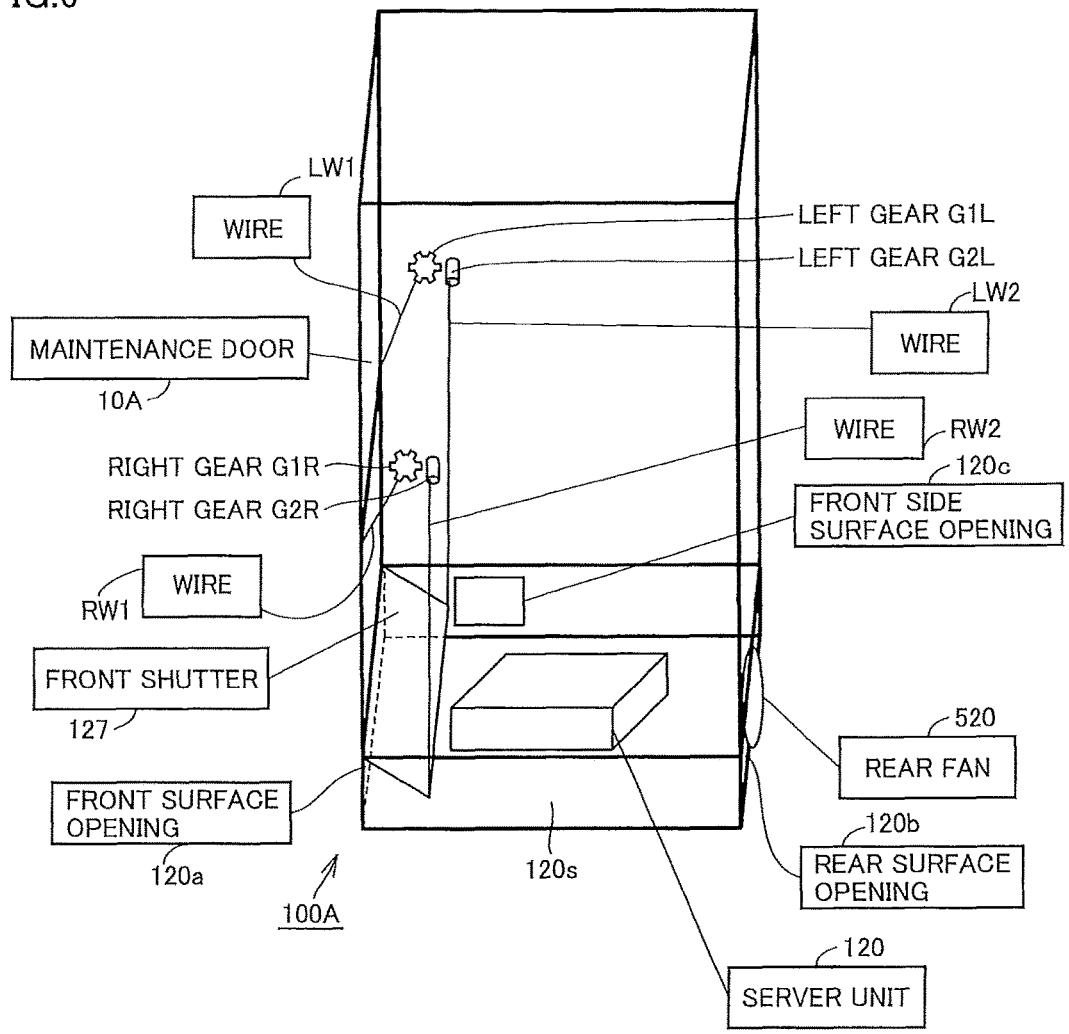
FIG. 6 generally shows a schematic configuration of an image formation apparatus according to a third embodiment in a first perspective view.
Figure 7:
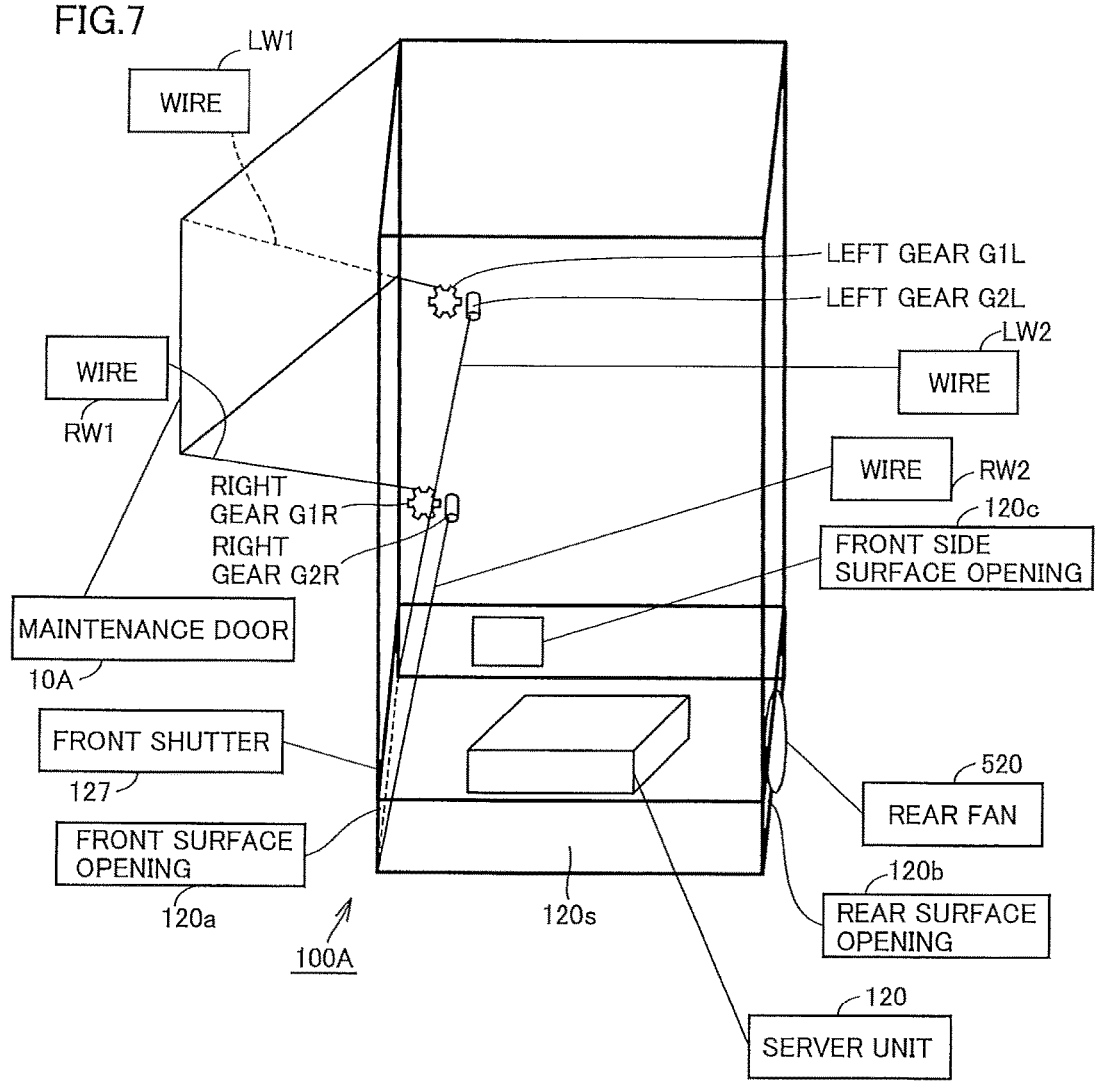
FIG. 7 generally shows a schematic configuration of the image formation apparatus according to the third embodiment in a second perspective view.
Figure 8:
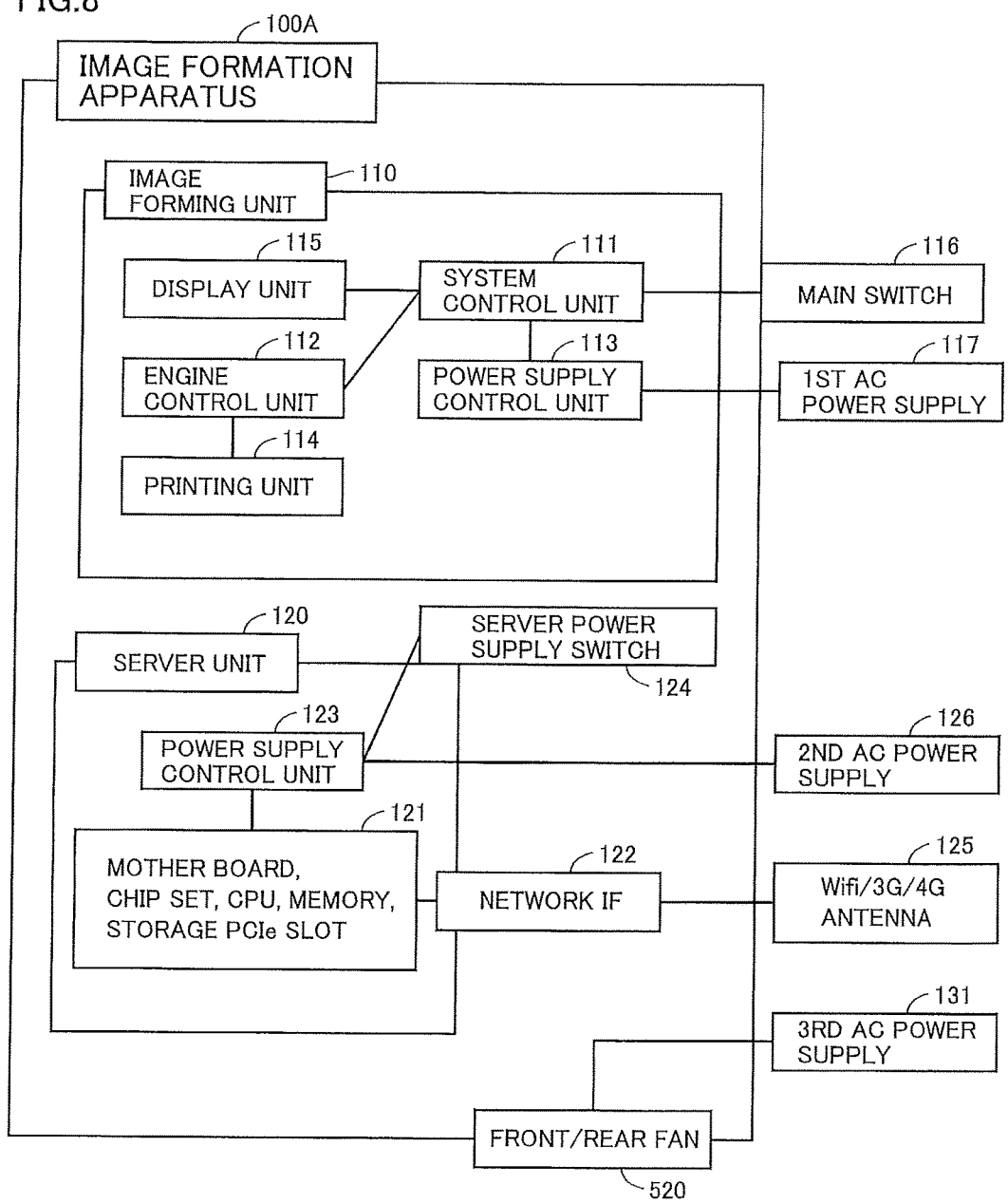
FIG. 8 is a block diagram showing a system configuration of the image formation apparatus according to the third embodiment.

With reference to FIGS. 6 to 8, a configuration of an image formation apparatus 100A in the present first embodiment will now be described. FIGS. 6 and 7 generally show a schematic configuration of image formation apparatus 100A in first and second perspective views, and FIG. 8 is a block diagram showing a system configuration of image formation apparatus 100A.

The system configuration of image formation apparatus 100A is basically identical to that of image formation apparatus 100 of the first embodiment. A difference therebetween is that a shutter mechanism is provided to a maintenance door 10A and a front shutter 127 provided to front surface opening 120a.

Maintenance door 10A is provided to be capable of being opened and closed with its upper end side serving as a pivot axis. Maintenance door 10A has a lower end side with one end coupled with a left wire LW1 wound on a left gear G1L and the other end coupled with a right wire RW1 wound on a right gear G1R. When the user opens maintenance door 10A, left gear G1L and right gear G1R rotate.

Front surface opening 120a is provided with front shutter 127. As well as maintenance door 10A, front shutter 127 is also provided to be capable of being opened and closed with its upper end side serving as a pivot axis. Front shutter 127 has a lower end side with one end coupled with a left wire LW2 wound on a left gear G2L and the other end coupled with a right wire RW2 wound on a right gear G2R.

Left gear G1L and left gear G2L mesh with each other, and when left gear G1L rotates, left gear G2L rotates. Right gear G1R and right gear G2R mesh with each other, and when right gear G1R rotates, right gear G2R rotates.

More specifically, as shown in FIG. 6, in a state with maintenance door 10A is closed, front shutter 127 is in a state in which it opens front surface opening 120a. As shown in FIG. 7, when maintenance door 10A is closed, left gear G1L and right gear G1R rotate and accordingly, left gear G2L and right gear G2R unwind wires LW2 and RW2, respectively, and by front shutter 127, front shutter 127 closes front surface opening 120a.

(System Configuration of Image Formation Apparatus 100A)

With reference to FIG. 8, a system configuration of image formation apparatus 100A will be described. When image formation apparatus 100A of the present embodiment is compared with the system configuration of image formation apparatus 100, the former dispenses with a photosensor detecting whether maintenance door 10A is opened/closed and a photosensor control unit. Further more, only rear fan 520 is provided as a fan. Rear fan 520 is supplied with power from third AC power supply 131 different than image forming unit 110.

(Hardware Configuration of Server Unit 120)

Again, with reference to FIG. 6, the hardware of server unit 120 includes server unit 120, server chassis 120s, rear fan 520, front surface opening 120a, rear surface opening 120b, front side surface opening 120c, and front shutter 127.

As has been described above, front shutter 127 is configured to close front surface opening 120a as maintenance door 10A is opened. As a result, by opening and closing maintenance door 10A, two streams of air are obtained, as follows:

A first stream of air (in a state with maintenance door 10A closed): Rear fan 520 is driven to suck air from the front side and exhaust the air to the rear side (similarly as indicated in FIG. 5 by arrow A); and A second stream of air (in a state with maintenance door 10A open): Front shutter 127 closes front surface opening 120a and rear fan 520 is driven to suck air through front side surface opening 120c and exhaust the air to the rear side (similarly as indicated in FIG. 5 by arrows B1 and B2).

Such a shutter mechanism allows the configuration without a photosensor or a photosensor control unit to also have a function and effect which is similar to that of image formation apparatus 100 of the first embodiment.

Conventionally, after supplying an image forming portion with power is stopped, driving a fan provided to decrease temperature inside the apparatus is stopped. When this is exactly applied to an image formation apparatus having a server unit and an image forming unit integrated together, there is a concern that a defect may be caused by a thermal load on the server unit.

In contrast, the image formation apparatus according to the above embodiment adopts a configuration in which when supplying power from the power supply unit to the image forming unit is stopped, at least one fan is still continuously driven, and sending external air into the server unit is not stopped. This can prevent a defect caused by a thermal load on an electronic board or the like of the server unit.

Although embodiments of the present invention have been described and illustrated in detail, it is clearly understood that the same is by way of illustration and example only and not limitation, the scope of the present invention should be interpreted by terms of the appended claims.

What is claimed is:

1. An image formation apparatus provided with an image forming unit and a server unit in a single housing,
   the image forming unit including a unit that accommodates a toner bottle therein,
   the housing including
      a maintenance door provided to the unit and configured to be opened and closed to allow the toner bottle to be attached and detached, and
      a same surface side suction portion that is provided in a same surface as the maintenance door for taking external air into the server unit, wherein when the maintenance door is opened, sucking external air through the same surface side suction portion is stopped.

2. The image formation apparatus according to claim 1, wherein
the housing includes a shutter mechanism that opens and closes the same surface side suction portion, and
when the maintenance door is in an open state, the shutter mechanism closes the same surface side suction portion and thus stops suction of air through the same surface side suction portion.

3. The image formation apparatus according to claim 1, wherein the housing includes a different surface side suction portion that is provided in a surface different from a surface provided with the maintenance door for taking external air into the server unit.

4. The image formation apparatus according to claim 3, wherein the different surface side suction portion has an opening ratio larger than that of the same surface side suction portion.

5. An image formation apparatus provided with an image forming unit and a server unit in a single housing, the image formation apparatus comprising:
a fan that ventilates the server unit;
a power supply unit that supplies the image forming unit and the fan with power; and
a power supply control unit that controls the power supply unit so that supplying the fan with power is not stopped when supplying power from the power supply unit to the image forming unit is stopped, wherein
the image forming unit includes a unit that accommodates a toner bottle therein,
the housing includes a maintenance door (i) provided at one surface of the housing, and (ii) configured to be opened and closed to allow the toner bottle to be attached and detached,
the housing includes a different surface side suction portion that is provided in a surface different from the one surface provided with the maintenance door for taking external air into the server unit, and
when the maintenance door is opened, supplying the image forming unit with power by the power supply unit is stopped.

6. The image formation apparatus according to claim 5, wherein:
the housing includes a detection unit that detects that the maintenance door is in an open state; and
the detection unit receives power from a power supply unit different from the power supply unit provided for the image forming unit.

7. The image formation apparatus according to claim 5, wherein
the housing includes a same surface side suction portion that is provided in a same surface as the one surface provided with the maintenance door for taking external air into the server unit, and
when the maintenance door is opened, sucking external air through the same surface side suction portion is stopped.

8. The image formation apparatus according to claim 5, wherein:
the housing includes
a same surface side suction portion that is provided in a same surface as the maintenance door for taking external air into the server unit, and
a shutter mechanism that opens and closes the same surface side suction portion; and
when the maintenance door is in an open state, the shutter mechanism closes the same surface side suction portion and thus stops suction of air through the same surface side suction portion.

9. The image formation apparatus according to claim 5, wherein
the different surface side suction portion has an opening ratio larger than that of the same surface side suction portion.

* * * * *